US012812951B2

(12) United States Patent
Hsieh et al.

(10) Patent No.: US 12,812,951 B2
(45) Date of Patent: Nov. 24, 2026

(54) TRANSISTOR STRUCTURE AND METHOD FOR FABRICATING THE SAME

(71) Applicant: INDUSTRIAL TECHNOLOGY RESEARCH INSTITUTE, Hsinchu (TW)

(72) Inventors: Chang-Yan Hsieh, Yilan County (TW); Po-Tsung Tu, Tainan City (TW); Jui-Chin Chen, Zhubei City (TW); Hui-Yu Chen, Taichung City (TW); Po-Chun Yeh, Taichung City (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 882 days.

(21) Appl. No.: 18/086,053

(22) Filed: Dec. 21, 2022

(65) Prior Publication Data

US 2024/0145559 A1 May 2, 2024

(30) Foreign Application Priority Data

Nov. 2, 2022 (TW) ................................ 111141794

(51) Int. Cl.
*H10D 64/23* (2025.01)
*H10D 30/01* (2025.01)
(Continued)

(52) U.S. Cl.
CPC ......... *H10D 64/258* (2025.01); *H10D 30/015* (2025.01); *H10D 30/47* (2025.01);
(Continued)

(58) Field of Classification Search
CPC .. H10D 64/514; H10D 30/015; H01L 23/291; H01L 23/3192
See application file for complete search history.

(56) References Cited

U.S. PATENT DOCUMENTS 6,518,622 B1 2/2003 Chew
6,740,535 B2 5/2004 Singh
(Continued)

FOREIGN PATENT DOCUMENTS

TW 492087 6/2002
TW 200818515 4/2008
(Continued)

OTHER PUBLICATIONS

Ahmet et al. "Effect of gate structures on the DC and RF performance of AlGaN/GaN HEMTs" 2018.
(Continued)

*Primary Examiner* — Mark V Prenty
(74) *Attorney, Agent, or Firm* — Maschoff Brennan

(57) ABSTRACT

A transistor structure includes a substrate, a source electrode, a drain electrode, a protective layer and a gate electrode. The source electrode and the drain electrode are provided on the substrate. The protective layer is provided on the substrate. The protective layer is provided between the source electrode and the drain electrode. The protective layer includes a first layer comprising a compound of silicon and oxygen and a second layer comprising a compound of silicon and nitrogen. The first layer is provided on the substrate, the second layer is provided on the first layer, and a through hole of the protective layer is formed to extend through the second layer and the first layer. The gate electrode is provided in the through hole, and the gate electrode is separated from at least part of the first layer so as to form an air gap therebetween.

9 Claims, 7 Drawing Sheets

(51) Int. Cl.

| | |
|---|---|
| ***H10D 30/47*** | (2025.01) |
| ***H10D 62/85*** | (2025.01) |
| ***H10D 64/01*** | (2025.01) |
| ***H10D 64/27*** | (2025.01) |
| ***H10P 14/692*** | (2026.01) |
| ***H10P 14/694*** | (2026.01) |
| ***H10P 50/28*** | (2026.01) |
| ***H10W 74/10*** | (2026.01) |
| ***H10W 74/43*** | (2026.01) |

(52) U.S. Cl.

CPC ......... *H10D 62/8503* (2025.01); *H10D 64/01* (2025.01); *H10D 64/514* (2025.01); *H10P 14/69215* (2026.01); *H10P 14/69433* (2026.01); *H10P 50/283* (2026.01); *H10W 74/147* (2026.01); *H10W 74/43* (2026.01)

(56) References Cited

U.S. PATENT DOCUMENTS

| | | | |
|---|---|---|---|
| 6,972,440 | B2 | 12/2005 | Singh |
| 7,501,669 | B2 | 3/2009 | Parikh |
| 7,692,222 | B2 | 4/2010 | Tabatabaie et al. |
| 9,691,850 | B2 | 6/2017 | Cheng |
| 2009/0267114 | A1 | 10/2009 | Nakayama |
| 2022/0140126 | A1 | 5/2022 | Laroche |
| 2024/0145559 | A1 * | 5/2024 | Hsieh ................ H01L 21/02164 |

FOREIGN PATENT DOCUMENTS

| | | |
|---|---|---|
| TW | 200832697 | 8/2008 |
| TW | 201806153 A | 2/2018 |
| TW | 202022951 | 6/2020 |
| TW | I749627 | 12/2021 |
| TW | 202217930 A | 5/2022 |

OTHER PUBLICATIONS

Lien et al., "Fabrication of 0.15-μm ⌈-Shaped Gate In0.52Al0.48As/In0.6Ga0.4As Metamorphic HEMTs Using DUV Lithography and Tilt Dry-Etching Technique" Feb. 2007.

Liu et al., "Mechanism of Increased High-Frequency Channel Noise With PECVD SiN Passivation in AlGaN/GaN HEMTs" Nov. 2009.

Ha et al., "Silicon Dioxide Passivation of AlGaN/GaN HEMTs for High Breakdown Voltage" Jun. 2006.

Lalinsky et al., "T-shaped gate based on poly Silpolyimide supported layers" Oct. 1998.

Taiwan Office Action dated Mar. 30, 2023 as received in application No. 111141794.

* cited by examiner

TRANSISTOR STRUCTURE AND METHOD FOR FABRICATING THE SAME

CROSS-REFERENCE TO RELATED APPLICATIONS

This application claims priority under 35 U.S.C. § 119 (a) on Patent Application No(s). 111141794 filed in Taiwan, R.O.C. on Nov. 2, 2022, the entire contents of which are hereby incorporated by reference.

TECHNICAL FIELD

This present disclosure relates to a transistor structure and a method for fabricating the transistor structure.

BACKGROUND

Group-III nitrides are favorable materials for wide-band-gap semiconductors due to their high electron mobility, high velocity saturation and large critical electric field, and therefore a preferred selection as a material for fabricating next generation high speed and high power switching components. At present, the fabrication of AlGaN/GaN-based high electron mobility transistor (HEMT) on a 4-inch or 6-inch silicon wafer has become mature. It is demonstrated that a RF power switching device using AlGaN/GaN-based HEMT exhibits excellent performance that breaks the limits of silicon-based materials.

However, some problems may happen when the processes of fabricating the transistor on the 4-inch or 6-inch silicon wafer is applied to fabricate the same on a larger silicon wafer. Due to the limitations of process compatibility, a conventional lift-off process for fabricating electrodes of the transistor may not suitable for 8-inch through 12-inch silicon wafers. Accordingly, the electrodes may be fabricated by deposition of a metal layer on the silicon wafer and dry etching of the metal layer.

SUMMARY

According to one embodiment of the present disclosure, a transistor structure includes a substrate, a source electrode, a drain electrode, a protective layer and a gate electrode. The source electrode and the drain electrode are provided on the substrate. The protective layer is provided on the substrate. The protective layer is provided between the source electrode and the drain electrode. The protective layer includes a first layer including a compound of silicon and oxygen and a second layer including a compound of silicon and nitrogen. The first layer is provided on the substrate, the second layer is provided on the first layer, and a through hole of the protective layer is formed to extend through the second layer and the first layer. The gate electrode is provided in the through hole, and the gate electrode is separated from at least part of the first layer so as to form an air gap therebetween.

According to another embodiment of the present disclosure, a method of fabricating transistor structure includes: forming a drain electrode and a source electrode on a substrate; forming a protective layer on the substrate and between the drain electrode and the source electrode, the protective layer includes a first layer including a compound of silicon and oxygen and at least one second layer including a compound of silicon and nitrogen, and the first layer is provided between the substrate and the at least one second layer; patterning the at least one second layer by dry etching, and patterning the first layer by wet etching, so as to form a through hole and an undercut of the protective layer; and forming a gate electrode in the through hole, the undercut separates the gate electrode from at least part of the first layer.

DETAILED DESCRIPTION

In the following detailed description, for purposes of explanation, numerous specific details are set forth in order to provide a thorough understanding of the disclosed embodiments. According to the description, claims and the drawings disclosed in the specification, one skilled in the art may easily understand the concepts and features of the present disclosure. The following embodiments further illustrate various aspects of the present disclosure, but are not meant to limit the scope of the present disclosure.

Figure 1:
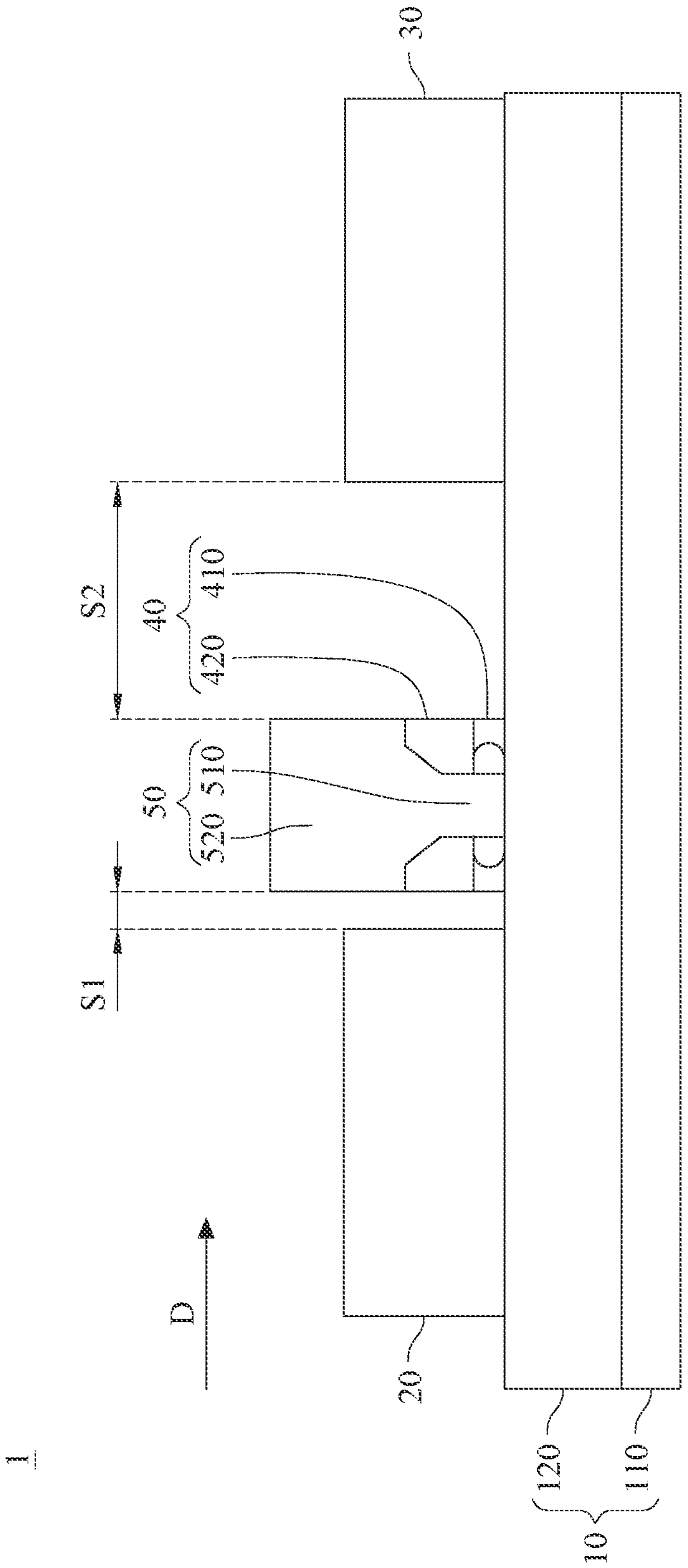
FIG. 1 is a schematic view of a transistor structure according to one embodiment of the present disclosure.
Figure 2:
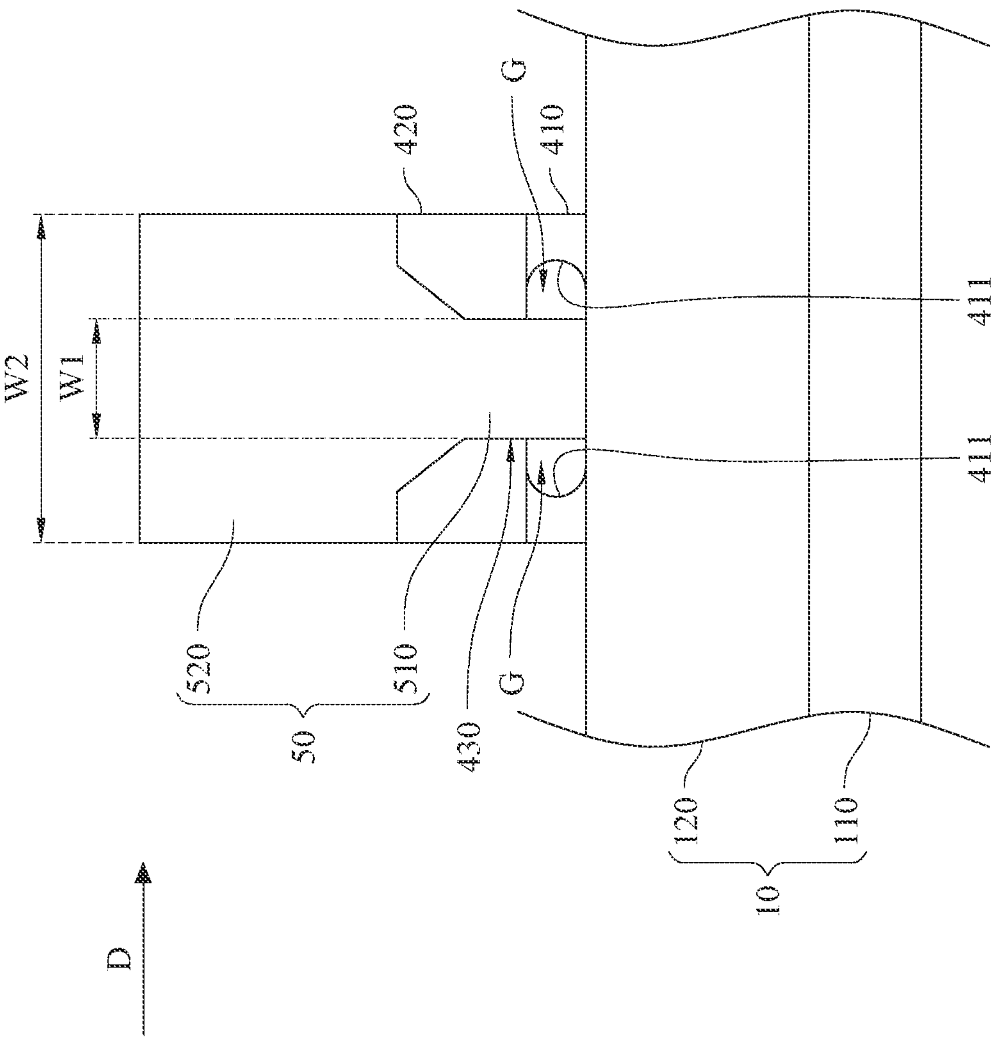
FIG. 2 is a partially enlarged view of the transistor structure in FIG. 1.

Please refer to FIG. 1 and FIG. 2. FIG. 1 is a schematic view of a transistor structure according to one embodiment of the present disclosure, and FIG. 2 is a partially enlarged view of the transistor structure in FIG. 1. In this embodiment, the transistor structure 1 is, for example but not limited to, a radio frequency (RF) component. The transistor structure 1 may include a substrate 10, a source electrode 20, a drain electrode 30, a protective layer 40 and a gate electrode 50.

The substrate 10 may include a silicon layer 110 and a gallium nitride layer 120, and the gallium nitride layer 120 is provided on the silicon layer 110. The source electrode 20 and the drain electrode 30 may be metal electrodes provided on the gallium nitride layer 120 of the substrate 10. The gallium nitride layer 120 formed on the silicon layer 110 is exemplary in this embodiment, and an aluminum gallium nitride layer may be formed on the silicon layer in some other embodiments.

The protective layer 40 may be provided on the substrate 10, and the protective layer 40 may be provided between the source electrode 20 and the drain electrode 30. Specifically, the protective layer 40 may include a first layer 410 including a compound of silicon and oxygen and a second layer 420 including a compound of silicon and nitrogen. The first layer 410 is provided on the gallium nitride layer 120 of the substrate 10, and the second layer 420 is provided on the first layer 410; that is, the first layer 410 is provided between the second layer 420 and the gallium nitride layer 120 of the substrate 10. The protective layer 40 may has a through hole 430 extending through the second layer 420 and the first layer 410. Specifically, the second layer 420 can be patterned by dry etching, and the first layer 410 can be patterned by wet etching, so as to form the through hole 430 of the protective layer 40. Also, a profile 411 of the first layer 410 treated by wet etching has specific corners, such as rounded corners. The etching of the protective layer 40 will be further described hereafter.

The gate electrode 50 may be a metal electrode, and at least part thereof may be provided in the through hole 430 of the protective layer 40. In detail, the gate electrode 50 is a T-gate which may include a foot portion 510 and a head portion 520, and a width W2 of the head portion 520 is greater than a width W1 of the foot portion 510. The foot portion 510 is provided in the through hole 430 of the protective layer 40, and the head portion 520 is provided on the second layer 420 of the protective layer 40. As shown in FIG. 2, the gate electrode 50 is separated from at least part of the first layer 410 so as to form air gaps G. Due to the formation of the air gap G, the first layer 410 of the protective layer 40 is separated from the foot portion 510 of the gate electrode 50, and the protective layer 40 physically contacts the gate electrode 50. Moreover, referring to FIG. 1, a distance S1 between the gate electrode 50 and the source electrode 20 is less than a distance S2 between the gate electrode 50 and the drain electrode 30 in an extension direction D of the substrate 10. The formation of the air gap G will be further described hereafter.

Figure 3:
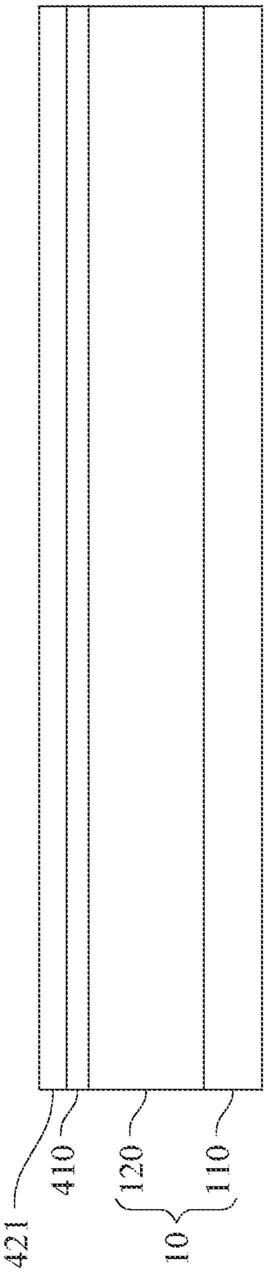
FIG. 3 through FIG. 10 are schematic views showing a process flow for fabricating the transistor structure according to one embodiment of the present disclosure.
Figure 4:
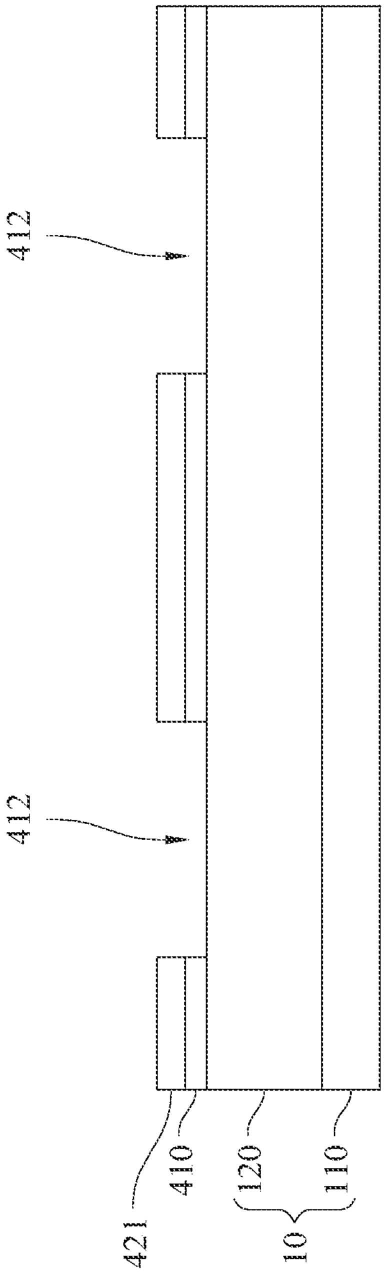

A method of fabricating the transistor structure 1 can be referred to FIG. 3 through FIG. 10 which illustrate schematic views showing a process flow for fabricating the transistor structure according to one embodiment of the present disclosure. As shown in FIG. 3 and FIG. 4, the first layer 410 is formed on the substrate 10. Specifically, the first layer 410 may be deposited on the gallium nitride layer 120 of the substrate 10 by, for example, plasma-enhanced chemical vapor deposition (PECVD), and a third layer 421 including a compound of silicon and nitrogen may be formed on the first layer 410 by, for example, PECVD. The first layer 410 and the third layer 421 be patterned by an etching process so as to form an aperture 412 that exposes the gallium nitride layer 120 of the substrate 10.

Figure 5:
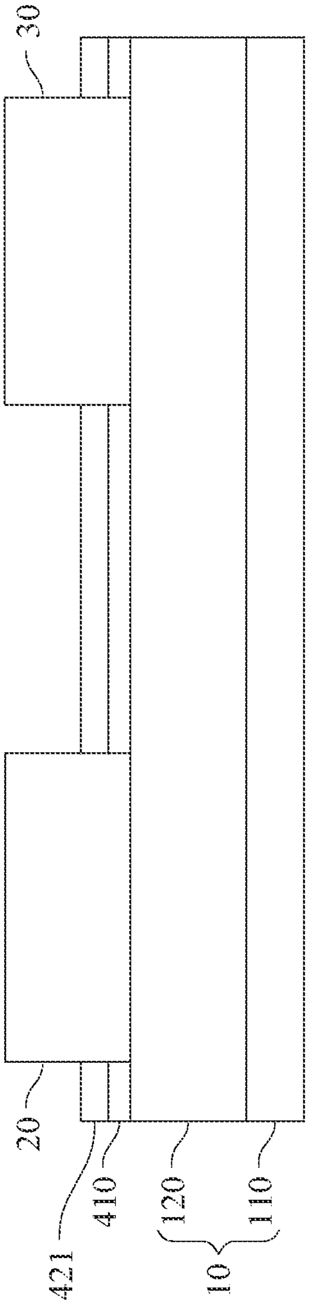

Then, the source electrode 20 and the drain electrode 30 are formed on the substrate 10. As shown in FIG. 5, a metal layer is deposited on the first layer 410 and in the aperture 412, and part of the metal layer on the third layer 421 is patterned to form the source electrode 20 and the drain electrode 30. Specifically, the metal layer may be filled into the aperture 412 and distributed over the surface of the third layer 421 by sputtering. The metal layer may be selected from the group consisting of titanium, aluminum, titanium nitride and a combination thereof. Next, the metal layer provided on the surface of the third layer 421 may be patterned by a photolithography process and an etching process to form the source electrode 20 and the drain electrode 30.

Figure 6:
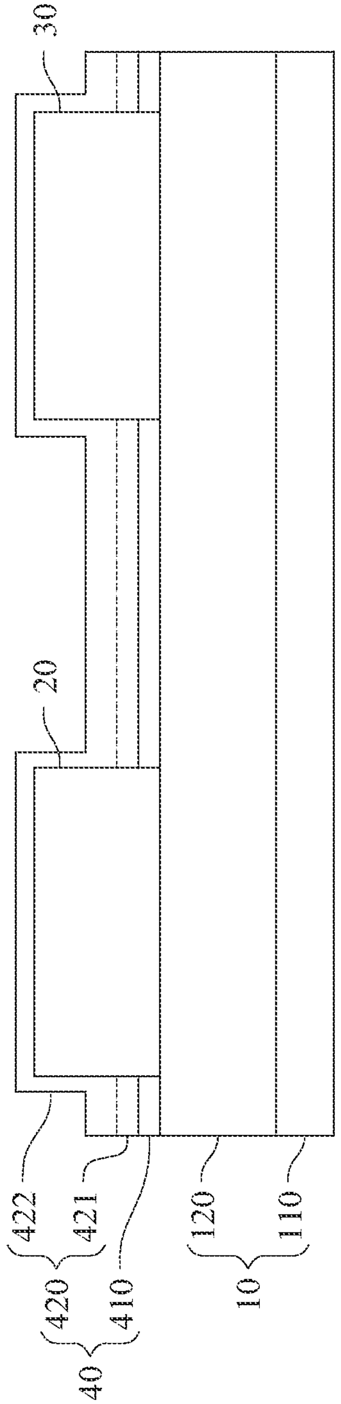

Then, the protective layer 40 is formed on the substrate 10. As shown in FIG. 6, a fourth layer 422 including a compound of silicon and nitrogen may be formed on the third layer 421 by, for example, PECVD, and the fourth layer 422 may cover the source electrode 20 and the drain electrode 30. The third layer 421 and the fourth layer 422 may be collectively referred to as the aforementioned second layer 420. The second layer 420 and the first layer 410 together form the protective layer 40 on the gallium nitride layer 120.

Figure 7:
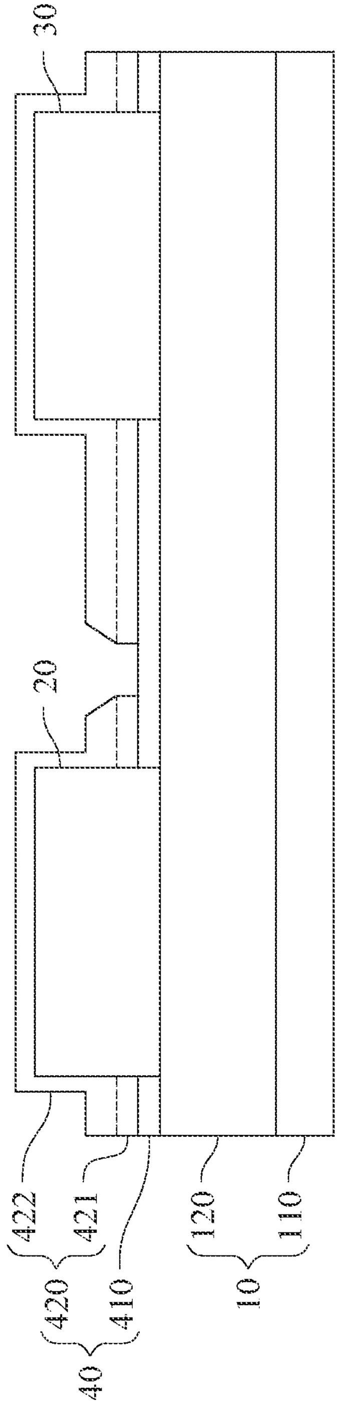
Figure 8:
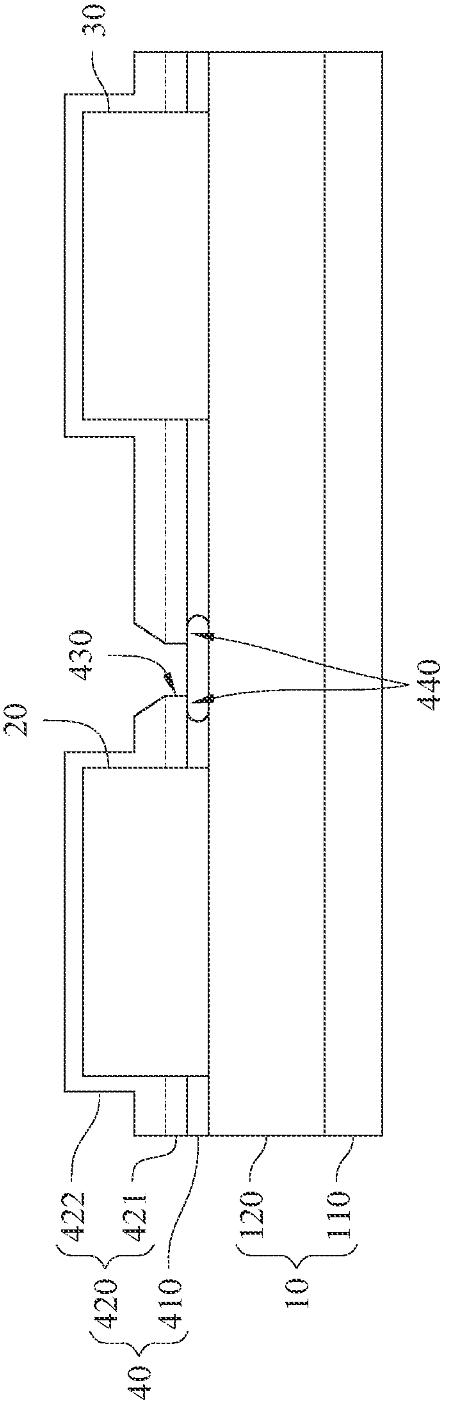

Then, a through hole 430 and an undercut 440 are formed in the protective layer 40. As shown in FIG. 7 and FIG. 8, the third layer 421 and the fourth layer 422 may be patterned by dry etching, the first layer 410 may be patterned by wet etching, to thereby form the through hole 430 and the undercut 440. In one implementation, the first layer 410 may be immersed by buffer oxide etch (BOE) to form the through hole 430 and the undercut 440. In the case of dry etching, the second layer 420 may form the through hole 430 with high aspect ratio, since SiNx enjoys better non-isotropic etching properties than SiOx. Also, in the case of wet etching, since SiOx enjoys better isotropic etching properties than SiNx and slow wet etching rate, the first layer 410 treated by wet etching forms the undercut 440 with symmetrical profile while the shape of the through hole 430 does not change significantly. Due to the characteristics of wet etching, the profile of first layer 410 which forms the undercut 440 has rounded corners.

Figure 9:
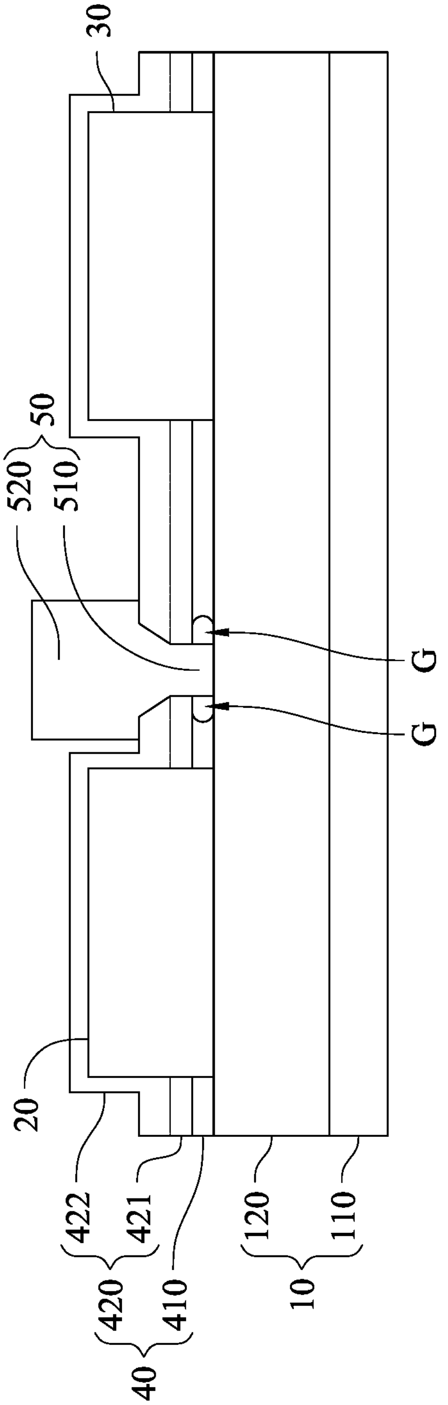

Then, the gate electrode 50 is formed in the through hole 430 of the protective layer 40. As shown in FIG. 9, a metal layer may be deposited on the second layer 420 and in the through hole 430 by sputtering. The metal layer may be selected from the group consisting of titanium, aluminum, titanium nitride and a combination thereof. Part of the metal layer on the surface of the second layer 420 may be patterned by a photolithography process and an etching process to form the gate electrode 50. Specifically, part of the metal layer inside the through hole 430 forms the foot portion 510 of the gate electrode 50, and the patterned part of the metal layer on the second layer 420 forms the head portion 520 of the gate electrode 50. The undercut 440 in FIG. 8 separates the foot portion 510 of the gate electrode 50 from the first layer 410 to thereby form the air gap G. The air gap G can act as a dielectric layer around the gate electrode 50 so as to effectively reduce the parasitic capacitance between the gate electrode 50 and both the source electrode 20 and the drain electrode 30 as well as improve the characteristics of high frequency components.

Figure 10:
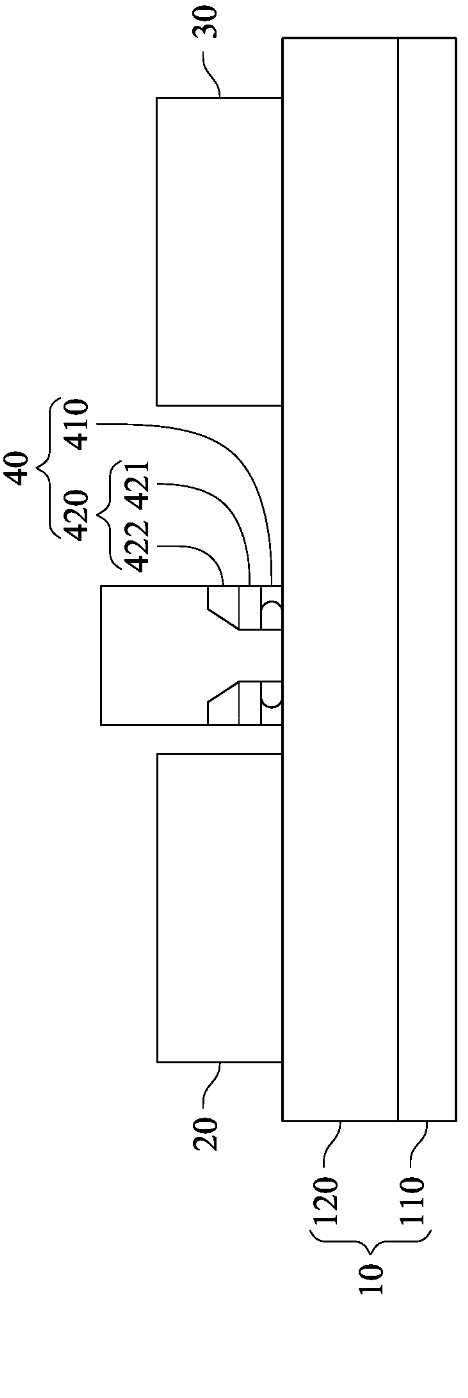

As shown in FIG. 10, the protective layer 40 may be further patterned by etching and lithography to remove the second layer 420 covering the source electrode 20 and the drain electrode 30, and also remove the first layer 410 and the second layer 420 between the gate electrode 50 and both the source electrode 20 and the drain electrode 30, such that the residual protective layer 40 is provided between the source electrode 20 and the drain electrode 30, and the protective layer 40 is separated from the source electrode 20 and the drain electrode 30.

In this embodiment, the formation of the first layer 410 and the third layer 421 in FIG. 3, the patterning of the first layer 410 and the third layer 421 in FIG. 4, the formation of the fourth layer 422 in FIG. 6, the patterning of the third layer 421 and the fourth layer 422 in FIG. 7, the patterning of the first layer 410 in FIG. 8, and the patterning of the first layer 410, the third layer 421 and the fourth layer 422 in FIG. 10 are included in a series of steps, and this series of steps may be referred to as the formation of the protective layer 40 according to the present disclosure in which the first layer 410 and the third layer 421 are formed prior to the formation of the source electrode 20 and the drain electrode 30. However, the present disclosure is not limited to the formation of the protective layer by the steps mentioned above.

In one embodiment, unlike the formation of the third layer 421 and the fourth layer 422 in FIG. 3 and FIG. 6, respectively, the formation of the second layer is not required to be divided into two steps. For example, a first layer and a single second layer may be formed before the formation of the source and drain electrodes, and there is no additional second layer formed after the formation of the source and drain electrodes.

In one embodiment, unlike that the source electrode 20 and the drain electrode 30 in FIG. 5 are formed after the formation of the first layer 410 and the third layer 421 in FIG. 4, each sub-layer of the protective layer may be formed after the formation of the source electrode 20 and the drain electrode 30. For example, the metal layer may be directly deposited on the substrate and patterned to form the source and drain electrodes, followed by the deposition of the first layer and the second layer.

In one embodiment, unlike the configuration in FIG. 10 obtained by patterning the protective layer 40 again after the formation of the gate electrode 50, the portion of the protective layer 40 between the gate electrode 50 and both the source electrode 20 and the drain electrode 30 may be remained. For example, the patterning of the protective layer after the formation of the gate electrode may only remove part of the second layer covering the top of the source and drain electrodes.

Figure 11:
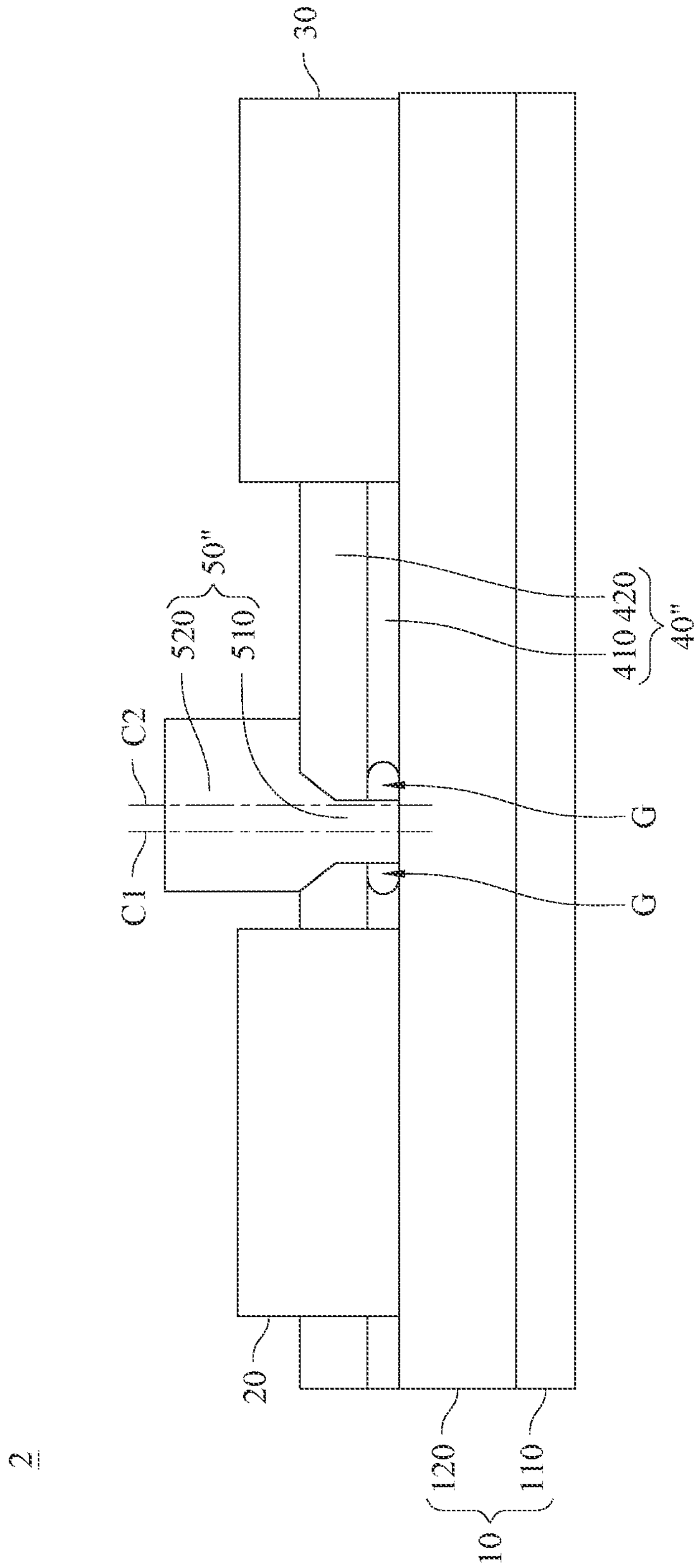
FIG. 11 is a schematic view of a transistor structure according to another embodiment of the present disclosure.

FIG. 11 is a schematic view of a transistor structure according to another embodiment of the present disclosure. In this embodiment, the transistor structure 2 may include a substrate 10, a source electrode 20, a drain electrode 30, a protective layer 40" and a gate electrode 50". Any detail description about the substrate 10, the source electrode 20 and the drain electrode 30 can be referred to FIG. 1, FIG. 2 and the corresponding content, and thus will be omitted hereafter.

The protective layer 40" may be provided between the source electrode 20 and the drain electrode 30, and may include a first layer 410 and a second layer 420. The protective layer 40 may have a through hole 430 extending through the second layer 420 and the first layer 410. Moreover, the second layer 420 and the first layer 410 physically contact the lateral surfaces of the source electrode 20 and the drain electrode 30.

The gate electrode 50" may include a foot portion 510 and a head portion 520. The foot portion 510 is provided in the through hole 430 of the protective layer 40", and the head portion 520 is provided on the second layer 420 of the protective layer 40". The gate electrode 50 is separated form at least part of the first layer 410 to form an air gap G. Also, a central axis C1 of the foot portion 510 may offset from a central axis C2 of the head portion 520; that is, the gate electrode 50" may be L-gate instead of T-gate.

According to the present disclosure, the first layer is patterned by wet etching to form an undercut. The undercut separates the gate electrode from at least part of the first layer to thereby form an air gap. The air gap acts as a dielectric layer around the gate electrode so as to effectively reduce the parasitic capacitance between the gate electrode and both the source electrode and the drain electrode as well as improve the characteristics of high frequency components.

As to a conventional process, in order to precisely control the shape of the gate electrode, the oxide or nitride layer, a protective layer for the fabrication of a transistor, is patterned by dry etching to form a through hole that matches the shape of the gate electrode, and then the gate electrode is formed in the through hole by a metal deposition process. Since dry etching may damage the AlGaN or GaN layer as the substrate of a wide-bandgap semiconductor and affect leakage current, wet etching, less harmful to AlGaN or GaN substrate, is used for patterning the protective layer. However, the isotropic wet etching of the protective layer cannot provide a profile with an undercut for forming said air gap configured to reduce the parasitic capacitance. Besides, since it is more difficult to control the wet etching rate, the real shape of the gate electrode may not meet the expectations. In order to meet the requirements of less damage to the substrate, precise gate electrode shape, and formation of the air gap to reduce parasitic capacitance, the protective layer according to the present disclosure includes a first layer provided on the substrate and a second layer provided on the first layer. The second layer can be patterned by dry etching to form a through hole that precisely defines the gate electrode shape, and the first layer can be patterned by wet etching to form the aforementioned undercut.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A transistor structure, comprising:

a substrate;

a source electrode and a drain electrode provided on the substrate;

a protective layer provided on the substrate, wherein the protective layer is provided between the source electrode and the drain electrode, the protective layer comprises a first layer comprising a compound of silicon and oxygen and a second layer comprising a compound of silicon and nitrogen, the first layer is provided on the substrate, the second layer is provided on the first layer, and a through hole of the protective layer is formed to extend through the second layer and the first layer; and a gate electrode provided in the through hole, wherein the gate electrode is separated from at least part of the first layer so as to form an air gap therebetween.

2. The transistor structure according to claim 1, wherein the substrate comprises a gallium nitride layer, and each of the source electrode, the drain electrode and the protective layer is provided on the gallium nitride layer.

3. The transistor structure according to claim 1, wherein the protective layer is separated from the source electrode and the drain electrode, and the protective layer physically contacts the gate electrode.

4. The transistor structure according to claim 1, wherein the through hole of the protective layer is formed by patterning the second layer by dry etching.

5. The transistor structure according to claim 1, wherein the through hole of the protective layer is formed by patterning the first layer by wet etching.

6. The transistor structure according to claim 1, wherein a profile of the first layer forming the air gap has rounded corners.

7. The transistor structure according to claim 1, wherein a distance between the gate electrode and the source electrode is less than a distance between the gate electrode and the drain electrode in an extension direction of the substrate.

8. The transistor structure according to claim 1, wherein the gate electrode comprises a head portion and a foot portion, the head portion has a greater width than the foot portion, the foot portion is provided in the through hole of the protective layer, and the head portion is provided on the second layer.

9. The transistor structure according to claim 8, wherein a central axis of the foot portion offsets from a central axis of the head portion.

* * * * *